United States Patent
Prushinskiy et al.

(10) Patent No.: US 8,946,733 B2
(45) Date of Patent: Feb. 3, 2015

(54) ORGANIC LIGHT-EMITTING DISPLAY APPARATUS HAVING A LIGHT-SCATTERING FACE AND METHOD OF MANUFACTURING THE SAME

(75) Inventors: Valeriy Prushinskiy, Yongin (KR); Len Kaplan, Yongin (KR); Se-Ho Cheong, Yongin (KR); Won-Sik Hyun, Yongin (KR); Min-Soo Kim, Yongin (KR); Kyong-Tae Park, Yongin (KR); Byoung-Seong Jeong, Yongin (KR); Jang-Seok Ma, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 351 days.

(21) Appl. No.: 13/366,253

(22) Filed: Feb. 3, 2012

(65) Prior Publication Data
US 2012/0235175 A1 Sep. 20, 2012

(30) Foreign Application Priority Data
Mar. 18, 2011 (KR) ......... 10-2011-0024341

(51) Int. Cl.
*H01L 33/00* (2010.01)
*H01L 51/52* (2006.01)
*H01L 27/32* (2006.01)

(52) U.S. Cl.
CPC ........ *H01L 51/5281* (2013.01); *H01L 27/3241* (2013.01); *H01L 27/322* (2013.01); *H01L 51/5268* (2013.01); *H01L 51/5284* (2013.01)
USPC ........ 257/88; 257/E33.065; 438/34; 313/500; 313/505

(58) Field of Classification Search
CPC ............ H01L 27/3246; H01L 27/3244; H01L 51/5268; H01L 27/3248; H01L 51/5203; H01L 51/5225; H01L 51/5284
USPC ............ 257/83, E33.065; 313/491, 500, 504, 313/505; 438/34
See application file for complete search history.

(56) References Cited

U.S. PATENT DOCUMENTS

| 5,047,687 A | 9/1991 | VanSlyke |
| 5,059,861 A | 10/1991 | Littman et al. |

(Continued)

FOREIGN PATENT DOCUMENTS

| JP | 1993-036475 | 2/1993 |
| JP | 1995-161474 | 6/1995 |

(Continued)

OTHER PUBLICATIONS

Patent Abstracts of Japan, Publication No. 08-306954 dated Nov. 22, 1996, corresponding to Japanese Patent 3694060, listed above, 2 pages.

(Continued)

*Primary Examiner* — Minh-Loan Tran
(74) *Attorney, Agent, or Firm* — Christie, Parker & Hale, LLP

(57) ABSTRACT

An organic light-emitting display apparatus that improves image quality characteristics, the organic light-emitting display apparatus including: a substrate; a first electrode formed on the substrate; a pixel-defining layer (PDL) formed on the first electrode to expose a set or predetermined region of the first electrode; an intermediate layer formed in the exposed predetermined region of the first electrode and including an organic emission layer; and a second electrode having a light-scattering face facing the substrate or facing oppositely away from the substrate, the second electrode being disposed on the intermediate layer.

23 Claims, 9 Drawing Sheets

(56) References Cited

U.S. PATENT DOCUMENTS

| | | |
|---|---|---|
| 5,073,446 A | 12/1991 | Scozzafava et al. |
| 6,815,887 B2 | 11/2004 | Lee et al. |
| 2010/0133998 A1* | 6/2010 | Nishikawa et al. ............ 313/505 |
| 2011/0175073 A1* | 7/2011 | Chang ............................ 257/40 |

FOREIGN PATENT DOCUMENTS

| | | |
|---|---|---|
| JP | 1996-222368 | 8/1996 |
| JP | 1997-274990 | 10/1997 |
| JP | 1998-335060 | 12/1998 |
| JP | 3694060 B2 | 9/2005 |
| KR | 10-0388271 B1 | 6/2003 |
| KR | 10-0528914 B1 | 11/2005 |
| KR | 10-0572237 B1 | 4/2006 |
| KR | 10-2006-0080638 A | 7/2006 |
| KR | 10-2006-0081648 A | 7/2006 |
| KR | 10-2007-0082689 A | 8/2007 |
| KR | 10-2007-0117894 A | 12/2007 |
| KR | 10-0955882 B1 | 5/2010 |

OTHER PUBLICATIONS

Korean Patent Abstracts, Publication No. 1020020029809 dated Apr. 20, 2002, corresponding to Korean Patent 10-0388271, listed above, 1 page.

Korean Patent Abstracts, Publication No. 1020040049252 dated Jun. 11, 2004, corresponding to Korean Patent 10-0572237, listed above, 1 page.

Korean Patent Abstracts, Publication No. 1020040094057 dated Nov. 9, 2004, corresponding to Korean Patent 10-0528914, listed above, 1 page.

Korean Patent Abstracts, Publication No. 1020090075018 dated Jul. 8, 2009, corresponding to Korean Patent 10-0955882, listed above, 1 page.

* cited by examiner

ORGANIC LIGHT-EMITTING DISPLAY APPARATUS HAVING A LIGHT-SCATTERING FACE AND METHOD OF MANUFACTURING THE SAME

CROSS-REFERENCE TO RELATED PATENT APPLICATION

This application claims priority to and the benefit of Korean Patent Application No. 10-2011-0024341, filed on Mar. 18, 2011, in the Korean Intellectual Property Office, the entire content of which is incorporated herein by reference.

BACKGROUND

1. Field of the Invention

One or more embodiments of the present invention relate to an organic light-emitting display apparatus and a method of manufacturing the same, and more particularly, to an organic light-emitting display apparatus that improves image quality characteristics and a method of manufacturing the same.

2. Description of the Related Art

In these days, thick and non-portable display apparatuses are being replaced by flat panel display apparatuses that are portable and have a thin profile. Among flat panel display apparatuses, organic light-emitting display apparatuses are self-luminescent and have larger viewing angles, better contrast characteristics, and faster response rates than the other display apparatuses, and thus, have drawn attention as a next-generation display apparatus.

An organic light-emitting display apparatus includes an intermediate layer, a first electrode, and a second electrode. The intermediate layer includes an organic emission layer from which visible light is generated when voltages are applied to the intermediate layer through the first electrode and the second electrode.

Image quality characteristics of the organic light-emitting display apparatus depend on several factors. Contrast characteristics are part of the image quality characteristics. In particular, when the organic light-emitting display apparatus is used, external light is incident on the organic light-emitting display apparatus, and the incident external light is reflected on surfaces of the first and second electrodes of the organic light-emitting display apparatus as well as on surfaces of other metal layers. The incident external light then proceeds toward a user, thereby lowering contrast characteristics of the organic light-emitting display apparatus are lowered.

As a result, there is a limitation on improving the image quality characteristics of the organic light-emitting display apparatus.

SUMMARY

Aspects of embodiments of the present invention are directed toward an organic light-emitting display apparatus that improves image quality characteristics easily, and a method of manufacturing the same.

According to an embodiment of the present invention, an organic light-emitting display apparatus includes: a substrate; a first electrode formed on the substrate; a pixel-defining layer (PDL) formed on the first electrode to expose a region of the first electrode; an intermediate layer formed in the exposed region of the first electrode and including an organic emission layer; and a second electrode having a light-scattering face facing the substrate or facing oppositely away from the substrate, the second electrode being disposed on the intermediate layer.

The light-scattering face may be formed as an uneven face.

The light-scattering face may be formed using a rubbing process.

The light-scattering face may be formed in a region corresponding to the intermediate layer and the PDL.

The intermediate layer and the PDL each may have an uneven face, and the light-scattering face contacts the uneven faces of the intermediate layer and the PDL.

The light-scattering face may have an uneven face corresponding to uneven shapes of the uneven faces of the intermediate layer and the PDL.

The organic light-emitting display apparatus may further include an insertion layer formed on the intermediate layer and the PDL, wherein: the second electrode is formed on an upper surface of the insertion layer, the insertion layer includes an uneven face, and the light-scattering face contacts the uneven face of the insertion layer.

The light-scattering face may have an uneven face corresponding to an uneven shape of the uneven face of the insertion layer.

The insertion layer may have a plurality of trenches, and the second electrode may contact the intermediate layer through the plurality of trenches.

The insertion layer may include a polymer material.

The insertion layer may include a black matrix material.

The insertion layer may include a color filter material.

The organic light-emitting display apparatus may further include a cover layer formed on the second electrode, wherein the light-scattering face is a face of the second electrode opposite to the face of the second electrode facing the substrate.

The cover layer may include an external light-absorbing material.

The organic light-emitting display apparatus may further include a thin-film transistor (TFT) formed between the substrate and the first electrode, the TFT including an active layer, a gate electrode, a source electrode, and a drain electrode, and being electrically connected to the first electrode.

According to another embodiment of the present invention, a method of manufacturing an organic light-emitting display apparatus includes: forming a first electrode on a substrate; forming a pixel-defining layer (PDL) on the first electrode to expose a region of the first electrode; and forming an intermediate layer on the exposed region of the first electrode, the intermediate layer including an organic emission layer; and forming a second electrode, the second electrode having a light-scattering face facing the substrate or facing oppositely away from the substrate.

The light-scattering face may be formed by using a rubbing process.

The rubbing process may be performed by a rubbing member, and the rubbing member may have a plurality of adhesion holes, and a residual material formed during the rubbing process may be exhausted through the plurality of adhesion holes.

The rubbing member may include a main body portion and a rubbing cloth disposed on an outer circumferential surface of the main body portion, and the main body portion may have an exposed face that is not covered by the rubbing cloth, and the adhesion holes are formed in the exposed face.

A rubbing process may be performed on surfaces of the intermediate layer and the PDL so that the intermediate layer and the PDL have uneven faces facing toward the second electrode, and the light-scattering face of the second electrode contacts the uneven faces of the organic emission layer and the PDL.

The method may further include forming an insertion layer between the intermediate layer and the PDL and the second electrode, wherein the insertion layer has an uneven face formed by performing a rubbing process, and the light-scattering face contacts the uneven face of the insertion layer.

When the rubbing process is performed, the insertion layer has a plurality of trenches so that the intermediate layer exposed through the plurality of trenches can contact or is configured to contact the second electrode through the plurality of trenches.

The method may further include forming a cover layer on an upper surface of the second electrode, wherein the light-scattering face of the second electrode is formed by performing a rubbing process on a face of the second electrode opposite to a face of the second electrode facing the substrate, and the light-scattering face contacts the cover layer.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION

The present invention will now be described more fully with reference to the accompanying drawings in which exemplary embodiments of the invention are shown.

Figure 1:
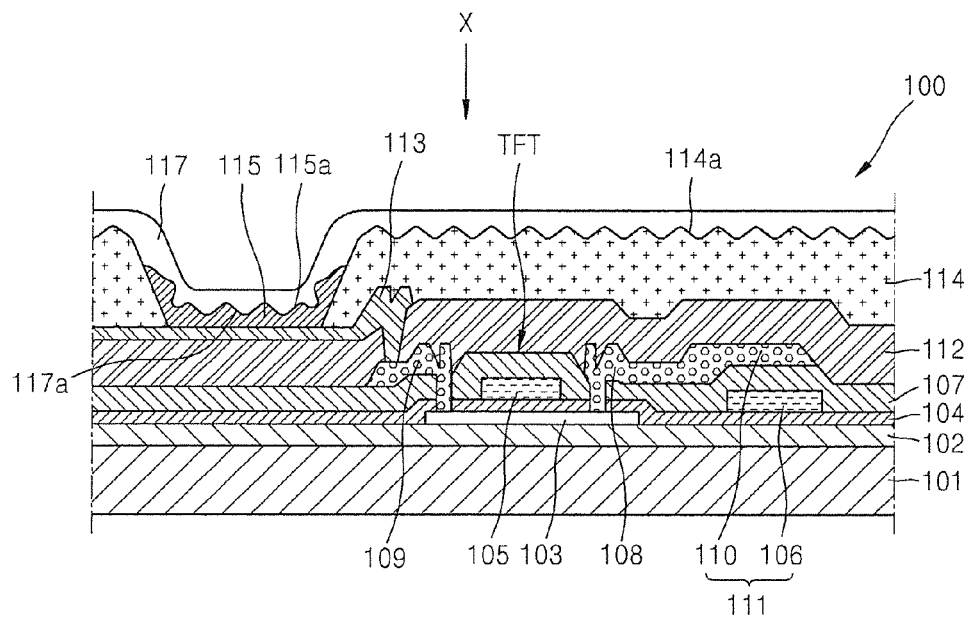
FIG. 1 is a schematic cross-sectional view of an organic light-emitting display apparatus according to an embodiment of the present invention.
Figure 2:
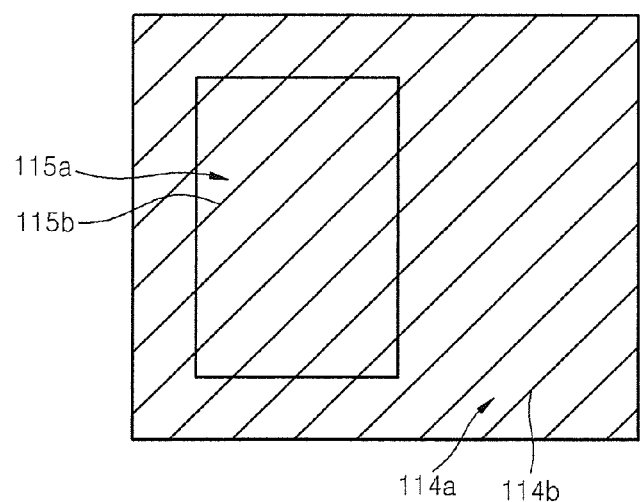
FIG. 2 is a schematic plan view of the organic light-emitting display apparatus illustrated in FIG. 1, taken along line X of FIG. 1.

FIG. 1 is a schematic cross-sectional view of an organic light-emitting display apparatus 100 according to an embodiment of the present invention, and FIG. 2 is a schematic plan view of the organic light-emitting display apparatus 100 illustrated in FIG. 1, taken along line X of FIG. 1. For convenience of explanation, FIG. 2 illustrates only a pixel-defining layer (PDL) 114 and an intermediate layer 115 of the organic light-emitting display apparatus 100.

Referring to FIGS. 1 and 2, the organic light-emitting display apparatus 100 includes a substrate 101, a thin-film transistor (TFT), a first electrode 113, an intermediate layer 115, and a second electrode 117.

The TFT includes an active layer 103, a gate electrode 105, a source electrode 108, and a drain electrode 109.

The present embodiment relates to an active matrix type organic light-emitting display apparatus 100 including a TFT. However, the present invention is not limited thereto and may also be applied to a passive matrix type organic light-emitting display apparatus.

Elements of the organic light-emitting display apparatus 100 will now be described in detail.

The substrate 101 may be formed of transparent glass that has a main ingredient of $SiO_2$. The substrate 101 is not limited thereto and may be formed of transparent plastics. In this regard, plastics used to form the substrate 101 may be one or more selected from various suitable organic materials. Also, when a top-emission type organic light-emitting display apparatus displays an image in an opposite direction to a direction of the substrate 101 of the organic light-emitting display apparatus 100, then the substrate 101 does not need to be transparent. Thus, the substrate 101 may also be formed of metal.

A buffer layer 102 is formed on the substrate 101. The buffer layer 102 may contain $SiO_2$ and/or $SiN_x$. The buffer layer 102 provides a flat face to an upper surface of the substrate 101 and prevents (or protects) moisture and foreign substances from penetrating into the substrate 101.

The active layer 103 having a set or predetermined pattern is formed on the buffer layer 102. The active layer 103 may be formed of an inorganic or organic semiconductor such as amorphous silicon and/or polysilicon. The active layer 103 includes a source region, a drain region, and a channel region. The source region and the drain region of the active layer 103 may be formed of amorphous silicon and/or polysilicon and then may be doped with Group III and/or IV impurities.

A gate insulating layer 104 is formed on an upper surface of the active layer 103, and the gate electrode 105 is formed in a set or predetermined region of an upper surface of the gate insulating layer 104. The gate insulating layer 104 may be formed of an organic material and/or an inorganic material such as SiNx and/or $SiO_2$, so as to insulate the active layer 103 and the gate electrode 105 from each other.

The gate electrode 105 may contain gold (Au), silver (Ag), copper (Cu), nickel (Ni), platinum (Pt), palladium (Pd), aluminum (Al), molybdenum (Mo), or an alloy such as an Al:Nd alloy, an Mo:W alloy, etc. However, the present invention is not limited thereto, and the gate electrode 105 may be formed of various suitable materials in consideration of adhesion, flatness, electrical resistance, processability, and the like with an adjacent layer.

An interlayer insulating layer 107 is formed to cover the gate electrode 105. The interlayer insulating layer 107 and the gate insulating layer 104 are formed to expose the source region and the drain region of the active layer 103, and a source electrode 108 and a drain electrode 109 are formed to respectively contact the exposed source region and drain region of the active layer 103.

The source electrode 108 and the drain electrode 109 may be formed of various suitable conductive materials and may have a single layer structure or a multilayer structure.

The organic light-emitting display apparatus 100 may further include one or more capacitors 111. A capacitor 111 includes a first capacitor electrode 106 and a second capacitor electrode 110. The first capacitor electrode 106 is formed on the gate insulating layer 104 and may be formed of the same material as a material used to form the gate electrode 105. The second capacitor electrode 110 is formed on the interlayer insulating layer 107 and may be formed of the same material as a material used to form the source electrode 108 or the drain electrode 109. Also, the second capacitor electrode 110 may extend to be connected to the source electrode 108.

The configuration of the capacitor 111 according to the present embodiment is a specific example, and the capacitor 111 may have various other suitable shapes.

A passivation layer 112 is formed on an upper surface of the TFT. In more detail, the passivation layer 112 is formed to cover the source electrode 108 and the drain electrode 109. Also, the passivation layer 112 covers the capacitor 111. The passivation layer 112 may be formed of various suitable insulating materials. In more detail, the passivation layer 112 may be formed of an organic or inorganic insulating material, or by combining an organic insulating material and an inorganic insulating material.

The passivation layer 112 is formed not to cover the entire portion of the drain electrode 109, but to expose a set or predetermined region of the drain electrode 109, and the first electrode 113 is connected to the exposed drain electrode 109.

The PDL 114 is formed on the first electrode 113 by using an insulating material. The PDL 114 is formed to expose a set or predetermined region of the first electrode 113, and the intermediate layer 115 contacts the exposed first electrode 113. The second electrode 117 is connected to the intermediate layer 115.

A surface of the intermediate layer 115 is formed as an uneven face 115a, and a surface of the PDL 114 is formed as an uneven face 114a. The uneven face 115a of the intermediate layer 115 and the uneven face 114a of the PDL 114 may be shaped as stripes that extend in a set or predetermined direction. In other words, as illustrated in FIG. 2, a protrusion 115b of the uneven face 115a of the intermediate layer 115 may be shaped as a stripe, and a protrusion 114b of the uneven face 114a of the PDL 114 may be shaped as a stripe. The shapes of the uneven faces 114a and 115a are easily formed by performing a rubbing process. In other words, by performing the rubbing process in one direction, the uneven faces 114a and 115a may be shaped as stripes that extend in a set or predetermined direction.

However, the present invention is not limited thereto, and the uneven faces 114a and 115a may be shaped as stripes that extend in a plurality of directions. In other words, the uneven faces 114a and 115a may be shaped as stripes that extend in a plurality of directions, by performing the rubbing process.

The second electrode 117 includes a light-scattering face 117a. In more detail, the light-scattering face 117a is a face (facing) in a direction toward the substrate 101, among faces of the second electrode 117. The light-scattering face 117a of the second electrode 117 contacts the uneven face 115a of the intermediate layer 115 and the uneven face 114a of the PDL 114. Here, in embodiments of the present invention, an uneven face can refer to a face having various stripes extending along one or more directions in a random or set pattern, or can refer to a face having various peaks and valleys in a random or set pattern. The light-scattering face 117a is formed as an uneven face having an uneven shape corresponding to the uneven shapes of the uneven faces 114a and 115a of the intermediate layer 115 and the PDL 114.

When an external light incident on the organic light-emitting display apparatus 100 reaches the light-scattering face 117a of the second electrode 117, the external light is scattered on the light-scattering face 117a having the uneven shape and is not emitted out of the organic light-emitting display apparatus 100, and therefore becomes extinct.

The intermediate layer 115 includes an organic emission layer. When voltages are applied to the intermediate layer 115 through the first electrode 113 and the second electrode 117, visible light is generated by the organic emission layer.

A sealing member may be disposed on the second electrode 117.

The sealing member protects the intermediate layer 115 or the other layers from external moisture, oxygen, or the like. The sealing member is formed of a transparent material. To this end, the sealing member may be formed of glass, plastic, or a combination of an organic material and an inorganic material.

The organic light-emitting display apparatus 100 according to the present embodiment includes the light-scattering face 117a as a face in a direction toward the substrate 101, among faces of the second electrode 117. Since the external light incident in the direction of the organic light-emitting display apparatus 100 is scattered through the light-scattering face 117a and fades (becomes extinct), the amount of external light reflected in the organic light-emitting display apparatus 100 is reduced such that contrast characteristics of the organic light-emitting display apparatus 100 are improved and image quality characteristics thereof are improved.

In addition, the uneven faces 114a and 115a are formed on the intermediate layer 115 and the PDL 114, respectively, and the second electrode 117 contacts the uneven faces 114a and 115a so that the light-scattering face 117a may be easily formed.

Figure 3:
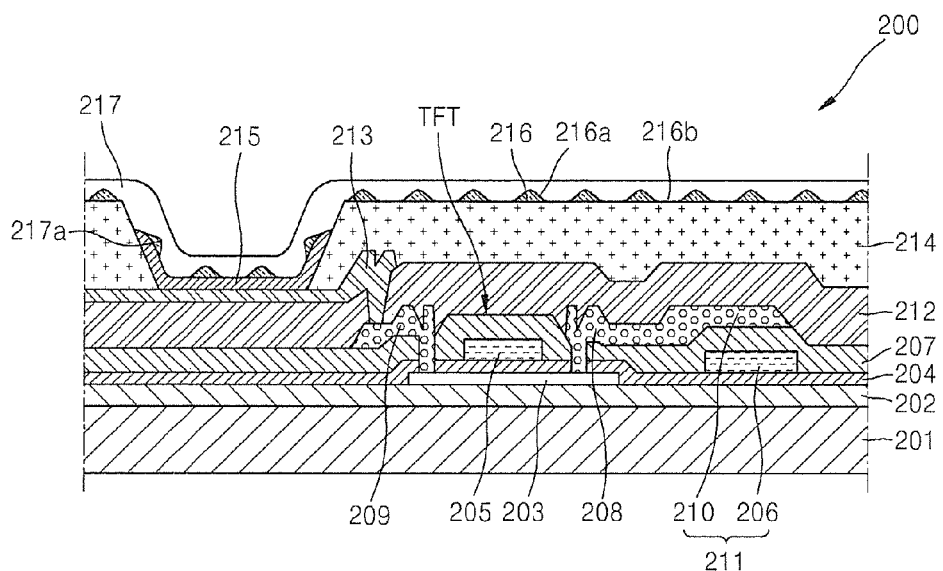
FIG. 3 is a schematic cross-sectional view of an organic light-emitting display apparatus according to another embodiment of the present invention.

FIG. 3 is a schematic cross-sectional view of an organic light-emitting display apparatus 200 according to another embodiment of the present invention. Referring to FIG. 3, the organic light-emitting display apparatus 200 includes a substrate 201, a TFT, a first electrode 213, an intermediate layer 215, an insertion layer 216, and a second electrode 217.

The TFT includes an active layer 203, a gate electrode 205, a source electrode 208, and a drain electrode 209.

A buffer layer 202 is formed on the substrate 201, and the active layer 203 having a set or predetermined pattern is formed on the buffer layer 202. A gate insulating layer 204 is formed on an upper surface of the active layer 203, and the gate electrode 205 is formed in a set or predetermined region of an upper surface of the gate insulating layer 204. An interlayer insulating layer 207 is formed on an upper surface of the gate electrode 205. The interlayer insulating layer 207 and the gate insulating layer 204 are formed to expose a source region and a drain region of the active layer 203, and a source electrode 208 and a drain electrode 209 are formed to respectively contact the exposed source region and drain region of the active layer 203.

The organic light-emitting display apparatus 200 may further include one or more capacitors 211. A capacitor 211 includes a first capacitor electrode 206 and a second capacitor electrode 210. The first capacitor electrode 206 is formed on the gate insulating layer 204 and may be formed of the same material as a material used to form the gate electrode 205. The second capacitor electrode 210 is formed on the interlayer insulating layer 207 and may be formed of the same material as a material used to form the source electrode 208 or the drain electrode 209. Also, the second capacitor electrode 210 may be formed as one body with the source electrode 208.

A passivation layer 212 is formed on an upper surface of the TFT. Also, the passivation layer 212 is formed to cover the capacitor 211. The passivation layer 212 is formed not to cover the entire portion of the drain electrode 209, but to expose a set or predetermined region of the drain electrode 209, and the first electrode 213 is connected to the exposed drain electrode 209.

A PDL 214 is formed on the first electrode 213 by using an insulating material. The PDL 214 is formed to expose a set or predetermined region of the first electrode 213, and the intermediate layer 215 contacts the exposed first electrode 213.

The insertion layer 216 is formed on the intermediate layer 215, and the second electrode 217 is formed on the insertion layer 216. The insertion layer 216 may be also formed on the PDL 214 for convenience of processes. A surface of the insertion layer 216 is formed as an uneven face 216a. Also, the insertion layer 216 includes a plurality of trenches 216b. The intermediate layer 215 is exposed through the trenches 216b, and the exposed intermediate layer 215 and the second electrode 217 contact each other.

The uneven shape of the uneven face 216a of the insertion layer 216 may be formed as stripes that extend in a set or predetermined direction (e.g., stripes with a set pattern). Also, a trench 216b of the insertion layer 216 may also have a stripe shape.

The insertion layer 216 may include various materials, for example, a polymer material. In more detail, the insertion layer 216 may be formed of polyimide that transmits visible light.

Also, the insertion layer 216 may include a black matrix material so as to improve external light anti-reflection characteristics of the organic light-emitting display apparatus 200. In this regard, the insertion layer 216 may contain a black matrix material entirely, or one face of the insertion layer 216 may be coated with a black matrix material.

Also, the insertion layer 216 may include a color filter material. In this regard, a portion of the incident external light that transmits the color filter material of the insertion layer 216 passes through the insertion layer 216 and is filtered such that the efficiency of visible light generated by the intermediate layer 215 is improved. In other words, the insertion layer 216 may be formed to include a color filter material having the same color as that of an organic emission layer formed in the intermediate layer 215 for each sub-pixel of the organic light-emitting display apparatus 200, such that luminance efficiency of the organic light-emitting display apparatus 200 may be improved.

The second electrode 217 includes a light-scattering face 217a. In more detail, the light-scattering face 217a is a face of the second electrode 217 in a direction toward the substrate 201. The light-scattering face 217a of the second electrode 217 contacts the uneven face 216a of the insertion layer 216. The light-scattering face 217a of the second electrode 217 is formed as an uneven face having an uneven shape corresponding to the uneven shape of the uneven face 216a of the insertion layer 216.

When an external light incident on the organic light-emitting display apparatus 200 reaches the light-scattering face 217a of the second electrode 217, the external light is scattered on the light-scattering face 217a having the uneven shape and is not emitted out of the organic light-emitting display apparatus 200, and therefore fads (becomes extinct).

The intermediate layer 215 includes the organic emission layer. When voltages are applied to the intermediate layer 215 through the first electrode 213 and the second electrode 217, visible light is generated by the organic emission layer.

A sealing member may be disposed on the second electrode 217. The organic light-emitting display apparatus 200 according to the present embodiment includes the light-scattering face 217a as a face of the second electrode 217 in a direction toward the substrate 201. Since the external light incident in a direction of the organic light-emitting display apparatus 200 is scattered through the light-scattering face 217a and becomes extinct, the amount of external light reflected in the organic light-emitting display apparatus 200 is reduced such that contrast characteristics of the organic light-emitting display apparatus 200 are improved and image quality characteristics thereof are improved.

Also, the uneven face 216a is formed in the insertion layer 216, and the second electrode 217 contacts the uneven face 216a so that the light-scattering face 217a may be easily formed.

In particular, since the intermediate layer 215 does not have an uneven face, a change in the luminescence characteristics of visible light, generated by the organic emission layer of the intermediate layer 215 due to damage to the surface of the intermediate layer 215, is prevented or reduced, and thus, image quality characteristics of the organic light-emitting display apparatus 200 may be improved.

Also, the insertion layer 216 either contains the black matrix material so that the external light anti-reflection characteristics of the organic light-emitting display apparatus 200 may be improved, or contains the color filter material so that the luminance efficiency of the organic light-emitting display apparatus 200 may be significantly improved.

Figure 4:
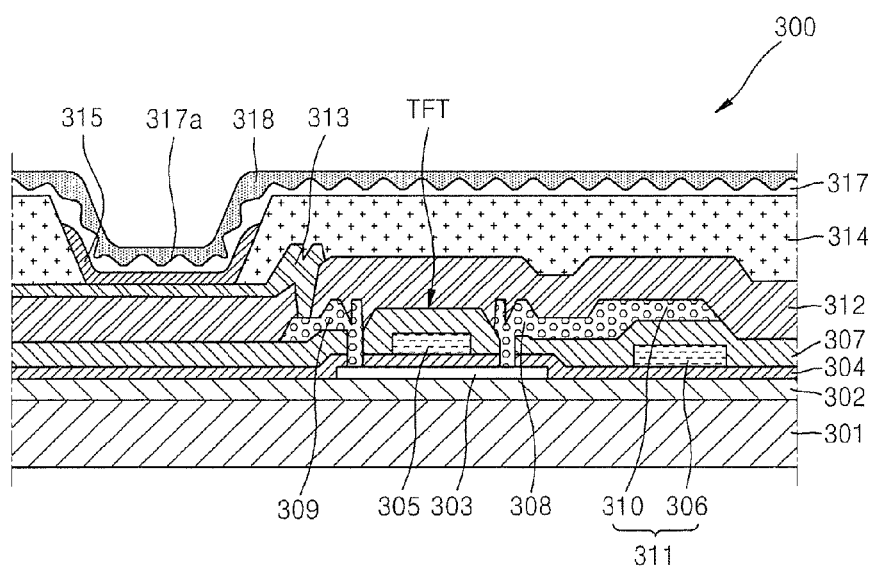
FIG. 4 is a schematic cross-sectional view of an organic light-emitting display apparatus according to another embodiment of the present invention.

FIG. 4 is a schematic cross-sectional view of an organic light-emitting display apparatus 300 according to another embodiment of the present invention. Referring to FIG. 4, the organic light-emitting display apparatus 300 includes a substrate 301, a TFT, a first electrode 313, an intermediate layer 315, a second electrode 317, and a cover layer 318.

The TFT includes an active layer 303, a gate electrode 305, a source electrode 308, and a drain electrode 309.

A buffer layer 302 is formed on the substrate 301, and the active layer 303 having a set or predetermined pattern is formed on the buffer layer 302. A gate insulating layer 304 is formed on an upper surface of the active layer 303, and the gate electrode 305 is formed in a set or predetermined region of an upper surface of the gate insulating layer 304. An interlayer insulating layer 307 is formed on an upper surface of the gate electrode 305. The interlayer insulating layer 307 and the gate insulating layer 304 are formed to expose a source region and a drain region of the active layer 303; and the source electrode 308 and the drain electrode 309 are formed to respectively contact the exposed source region and the exposed drain region of the active layer 303.

The organic light-emitting display apparatus 300 may further include one or more capacitors 311. A capacitor 311 includes a first capacitor electrode 306 and a second capacitor electrode 310. The first capacitor electrode 306 is formed on the gate insulating layer 304 and may be formed of the same material as a material used to form the gate electrode 305. The second capacitor electrode 310 is formed on the interlayer insulating layer 307 and may be formed of the same material as a material used to form the source electrode 308 or the drain electrode 309. Also, the second capacitor electrode 310 may be formed as one body with the source electrode 308.

A passivation layer 312 is formed on an upper surface of the TFT. Also, the passivation layer 312 covers the capacitor 311. The passivation layer 312 is formed, not to cover the entire portion of the drain electrode 309, but to expose a set or predetermined region of the drain electrode 309, and the first electrode 313 is connected to the exposed drain electrode 309.

A PDL 314 is formed on the first electrode 313 by using an insulating material. The PDL 314 is formed to expose a set or predetermined region of the first electrode 313, and the intermediate layer 315 contacts the exposed first electrode 313.

The second electrode 317 is formed on the intermediate layer 315. The second electrode 317 includes a light-scattering face 317a formed on its upper surface. In more detail, the light-scattering face 317a is a face of the second electrode 317 opposite to a face of the second electrode facing the substrate

301. The light-scattering face 317a is formed as an uneven face and may be shaped as stripes that extend in a set or predetermined direction.

When an external light incident on the organic light-emitting display apparatus 300 reaches the light-scattering face 317a of the second electrode 317, the external light is scattered on the light-scattering face 317a having the uneven shape and is not emitted out of the organic-light emitting display apparatus 300, and therefore becomes extinct.

A cover layer 318 is formed on the second electrode 317. The cover layer 318 formed on the second electrode 317 protects the second electrode 317, in particular, the light-scattering face 317a of the second electrode 317. Also, the cover layer 318 may contain an external light-absorbing material so that the external light anti-reflection characteristics of the organic light-emitting display apparatus 300 may be improved.

The intermediate layer 315 includes an organic emission layer. When voltages are applied to the intermediate layer 315 through the first electrode 313 and the second electrode 317, visible light is generated by the organic emission layer.

A sealing member may be disposed on the cover layer 318.

The organic light-emitting display apparatus 300 according to the present embodiment, includes the light scattering face 317a formed on a face of the second electrode 317 opposite to a face of the second electrode 317 facing the substrate 301. Since the external light incident on the organic light-emitting display apparatus 300 is scattered through the light-scattering face 317a and becomes extinct, the amount of external light reflected in the organic light-emitting display apparatus 300 is reduced such that contrast characteristics of the organic light-emitting display apparatus 300 are improved and image quality characteristics thereof are improved.

Also, since the intermediate layer 315 does not have an uneven face (and the PDL 314 also does not have an uneven face), a change in the luminescence characteristics of visible light, generated by the organic emission layer of the intermediate layer 315 due to damage to the surface of the intermediate layer 315, may be prevented or reduced, and thus, image quality characteristics of the organic light-emitting display apparatus 300 may be improved.

Also, the cover layer 318 is formed on the second electrode 317 in such a way that the cover layer 318 formed on the second electrode 317 protects the light-scattering face 317a of the second electrode 317 efficiently and external light-scattering characteristics of the organic light-emitting display apparatus 300 are continuously maintained. In one embodiment, the cover layer 318 contains an external light-absorbing material so that contrast characteristics and image quality characteristics of the organic light-emitting display apparatus may be further improved due to an improvement in the external light anti-reflection characteristics of the organic light-emitting display apparatus 300.

Figure 5A:
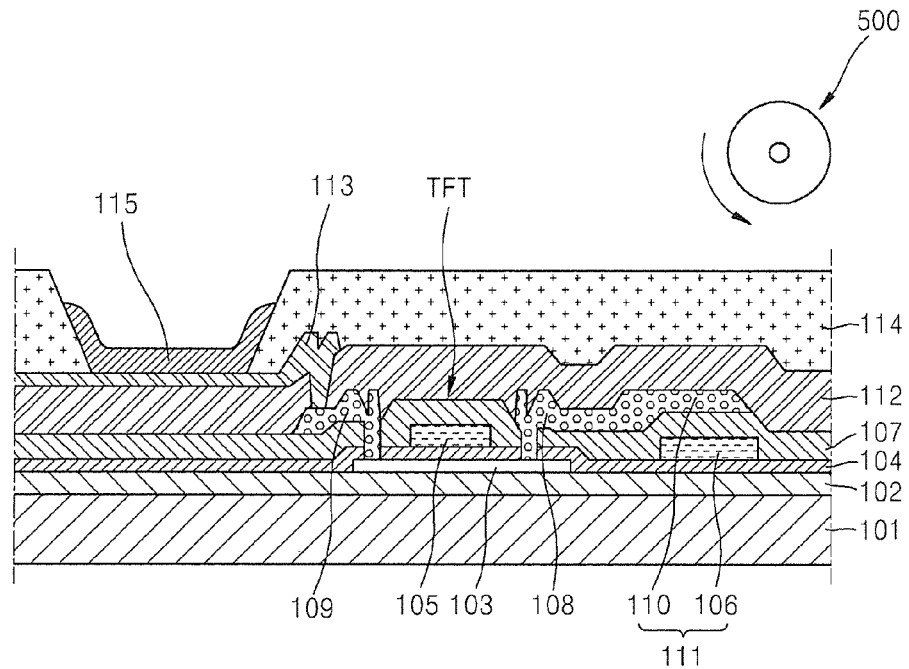
FIGS. 5A through 5C are cross-sectional views of a method of manufacturing an organic light-emitting display apparatus, according to an embodiment of the present invention.
Figure 5B:
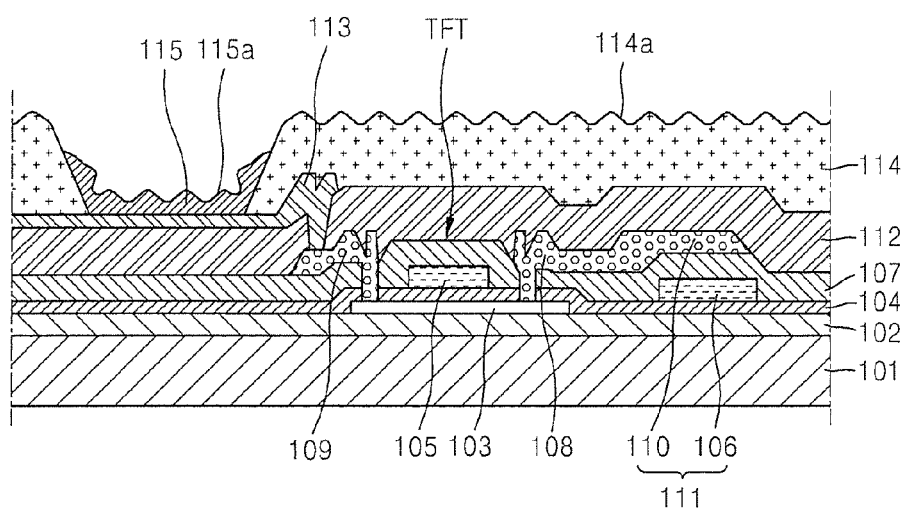
Figure 5C:
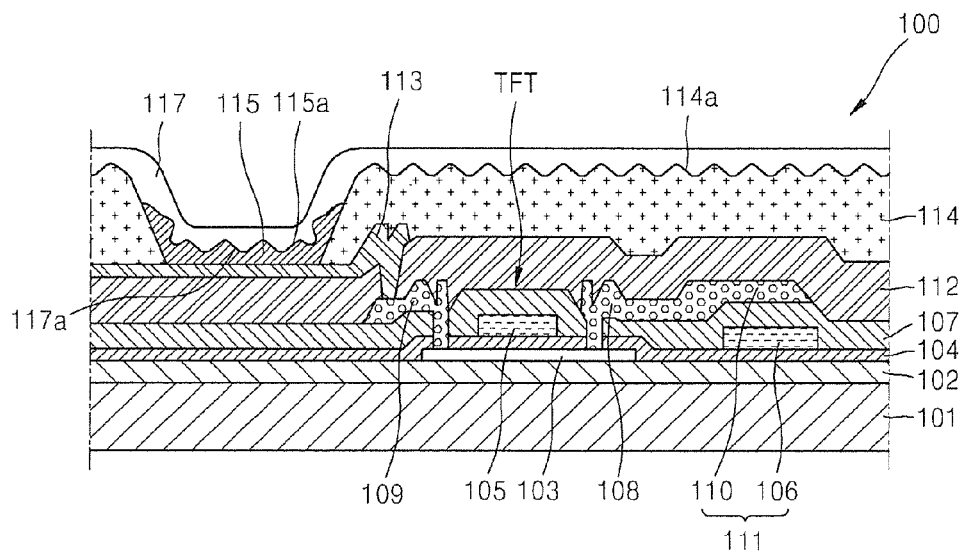

FIGS. 5A through 5C are cross-sectional views of a method of manufacturing an organic light-emitting display apparatus, according to an embodiment of the present invention.

Referring to FIG. 5A, a buffer layer 102 is formed on a substrate 101. A TFT is formed on the buffer layer 102. The TFT includes an active layer 103, a gate electrode 105, a source electrode 108, and a drain electrode 109. A gate insulating layer 104 insulates the active layer 103 and the gate electrode 105 from each other, and an interlayer insulating layer 107 insulates the gate electrode 105, the source electrode 108, and the drain electrode 109 from one another.

Also, one or more capacitors 111 may be formed on the substrate 101. A capacitor 111 includes a first capacitor electrode 106 and a second capacitor electrode 110. The first capacitor electrode 106 is formed on the gate insulating layer 104 and may be formed of the same material as a material used to form the gate electrode 105. The second capacitor electrode 110 is formed on the interlayer insulating layer 107 and may be formed of the same material as a material used to form the source electrode 108 or the drain electrode 109. Also, the second capacitor electrode 110 may be formed as one body with the source electrode 108.

The configuration of the capacitor 111 according to the present embodiment is a specific example, and the capacitor 111 may have various suitable shapes.

A passivation layer 112 is formed on an upper surface of the TFT, and a first electrode 113 is connected to the drain electrode 109. A PDL 114 is formed on the first electrode 113 by using an insulating material. The PDL 114 is formed to expose a set or predetermined region of the first electrode 113 and to contact the exposed first electrode 113.

The intermediate layer 115 includes an organic emission layer that produces visible light.

Then, a rubbing process is performed on the exposed surface of the intermediate layer 115 and the PDL 114 by using a rubbing member 500. Although a rubbing cloth is not shown, an uneven face having a set or predetermined shape may be formed after the rubbing process is performed by using the rubbing cloth included in the rubbing member 500.

Referring to FIG. 5B, an uneven face 115a is formed on the surface of the intermediate layer 115 by performing the rubbing process using the rubbing member (see 500 of FIG. 5A), and an uneven face 114a is formed on the surface of the PDL 114.

The uneven shapes of the uneven face 115a of the intermediate layer 115 and the uneven face 114a of the PDL 114 may be formed as stripes that extend in a set or predetermined direction. In other words, the uneven faces 114a and 115a may be shaped as stripes that extend in a set or predetermined direction, by performing the rubbing process by moving the rubbing member 500 in a set or predetermined direction.

However, the present invention is not limited thereto, and the uneven faces 114a and 115a may be shaped as stripes formed in a plurality of directions. In other words, when the rubbing process is performed, the uneven faces 114a and 115a may be shaped as stripes that proceed in a plurality of directions and are formed in various suitable directions.

Referring to FIG. 5C, the organic light-emitting display apparatus 100 is completely manufactured by forming the second electrode 117. The second electrode 117 includes a light-scattering face 117a. In more detail, the light-scattering face 117a is a face of the second electrode 117 in a direction toward the substrate 101. The light-scattering face 117a of the second electrode 117 contacts the uneven face 115a of the intermediate layer 115 and the uneven face 114a of the PDL 114. The light-scattering face 117a is formed as an uneven face having an uneven shape corresponding to the uneven shapes of the uneven faces 114a and 115a.

A sealing member may be disposed on the second electrode 117. The sealing member protects the intermediate layer 115 and the other layers from external moisture, oxygen, or the like. The sealing member is formed of a transparent material. To this end, the sealing member may be formed of glass, plastic, or a combination of an organic material and an inorganic material.

In the method of manufacturing the organic light-emitting display apparatus 100, the uneven faces 114a and 115a of the PDL 114 and the intermediate layer 115 are formed using the rubbing process, and the second electrode 117 contacts the uneven surfaces 114a and 115a of the PDL 114 and the intermediate layer 115.

Figure 6A:
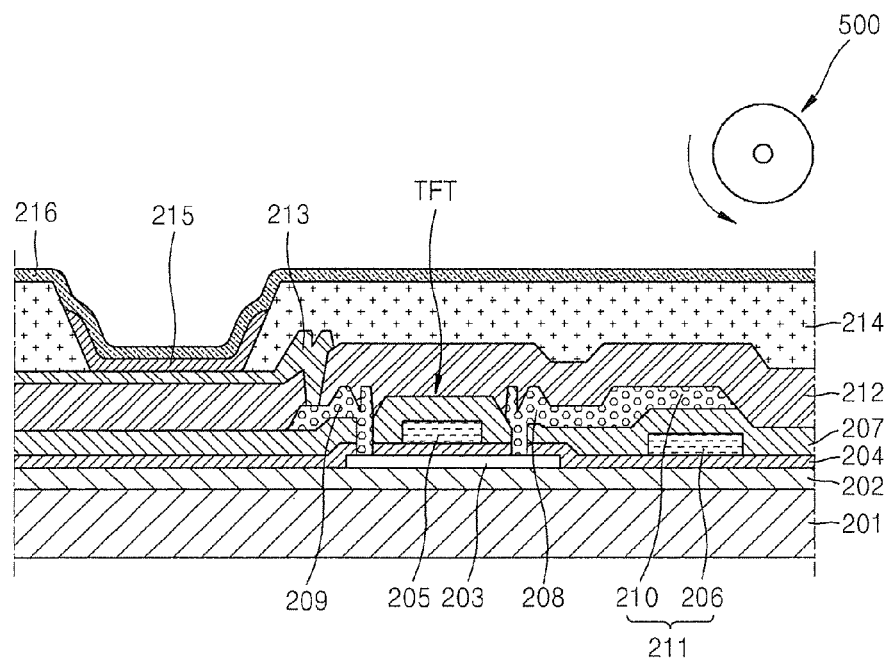
FIGS. 6A through 6C are cross-sectional views of a method of manufacturing an organic light-emitting display apparatus, according to another embodiment of the present invention.
Figure 6B:
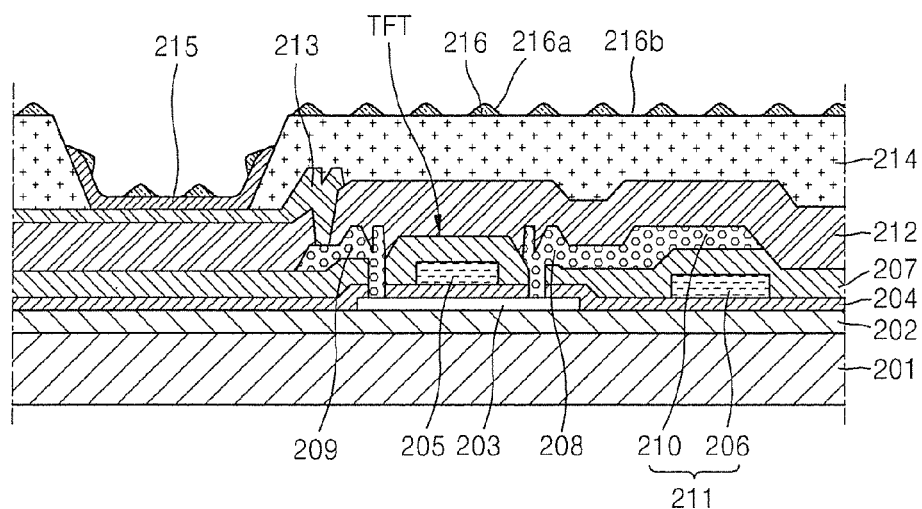
Figure 6C:
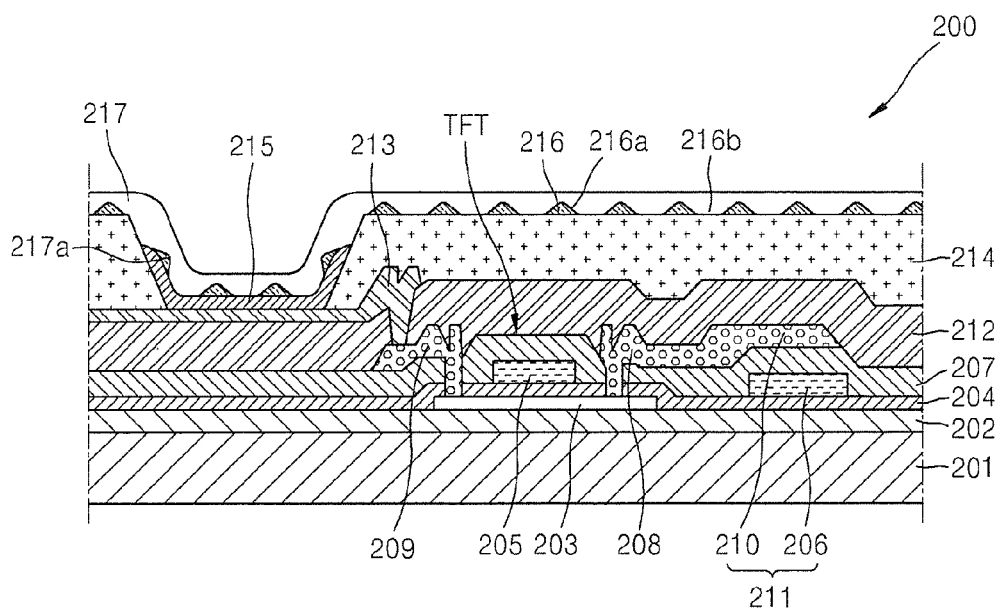

FIGS. 6A through 6C are cross-sectional views of a method of manufacturing an organic light-emitting display apparatus, according to another embodiment of the present invention.

Referring to FIG. 6A, a buffer layer 202 is formed on a substrate 201. A TFT is formed on the buffer layer 202. The TFT includes an active layer 203, a gate electrode 205, a source electrode 208, and a drain electrode 209. A gate insulating layer 204 insulates the active layer 203 and the gate electrode 205 from each other, and an interlayer insulating layer 207 insulates the gate electrode 205, the source electrode 208, and the drain electrode 209 from one another.

In addition, one or more capacitors 211 may be formed on the substrate 201.

A capacitor 211 includes a first capacitor electrode 206 and a second capacitor electrode 210. The first capacitor electrode 206 is formed on the gate insulating layer 204 and may be formed of the same material as a material used to form the gate electrode 205. The second capacitor electrode 210 is formed on the interlayer insulating layer 207 and may be formed of the same material as a material used to form the source electrode 208 or the drain electrode 209. Also, the second capacitor electrode 210 may be formed as one body with the source electrode 208.

A passivation layer 212 is formed on an upper surface of the TFT, and a first electrode 213 is connected to the drain electrode 209. A PDL 214 is formed on the first electrode 213 by using an insulating material. The PDL 214 is formed to expose a set or predetermined region of the first electrode 213, and an intermediate layer contacts the exposed first electrode 213. The intermediate layer 215 includes an organic emission layer.

An insertion layer 216 is formed on the intermediate layer 215. The insertion layer 216 may include various suitable materials, for example, a polymer material. In more detail, the insertion layer 216 may be formed of polyimide that transmits visible light.

Also, the insertion layer 216 may include a black matrix material so as to improve external light anti-reflection characteristics of the organic light-emitting display apparatus 200. In this regard, the insertion layer 216 may contain a black matrix material entirely, or one face of the insertion layer 216 may be coated with a black matrix material.

Also, the insertion layer 216 may include a color filter material. In this regard, a portion of the incident external light that transmits through the color filter material is filtered by the color filter material so that the efficiency of visible light generated by the intermediate layer 215 may be improved. Thus, the luminescence efficiency of the organic light-emitting display apparatus 200 to be finally manufactured may be improved.

Then, a rubbing process is performed on the exposed surface of the insertion layer 216 by using a rubbing member 500. An uneven face having a set or predetermined shape may be formed after the rubbing process is performed by using the rubbing member 500 that includes a rubbing cloth.

Referring to FIG. 6B, after the rubbing process is performed by using the rubbing member 500, an uneven face 216a is formed on the surface of the insertion layer 216. In this regard, the rubbing process is performed in such a way that the insertion layer 216 may include a plurality of trenches 216b. The intermediate layer 215 is exposed through the trenches 216b.

Referring to FIG. 6C, a second electrode 217 is formed on the insertion layer 216, thereby completing the manufacture of the organic light-emitting display apparatus 200. The intermediate layer 215 is exposed through the trenches 216b, and the exposed intermediate layer 215 and the second electrode 217 contact each other.

The uneven shape of the uneven face 216a of the insertion layer 216 may be formed as stripes that extend in a set or predetermined direction. Also, the trenches 216b of the insertion layer 216 may each have a stripe shape.

The second electrode 217 includes a light-scattering face 217a. In more detail, the light-scattering face 217a is a face of the second electrode 217 (facing) in a direction toward the substrate 201. The light-scattering face 217a contacts the uneven face 216a of the insertion layer 216. The light-scattering face 217a is formed as an uneven face having an uneven shape corresponding to the uneven shape of the uneven face 216a.

A sealing member may be disposed on the second electrode 217.

In the method of manufacturing the organic light-emitting display apparatus 200 according to the present embodiment, the uneven face 216a of the insertion layer 216 is formed using the rubbing process, and the second electrode 217 contacts the uneven face 216a so that the light-scattering face 217a may be easily formed.

In particular, since an uneven face is not formed on the intermediate layer 215, a change in the luminescence characteristics of visible light, generated by the organic light-emitting light of the intermediate layer 215 due to damage to the surface of the intermediate layer 215, is prevented or reduced, and thus, image quality characteristics of the organic light-emitting display apparatus 200 may be improved.

Figure 7A:
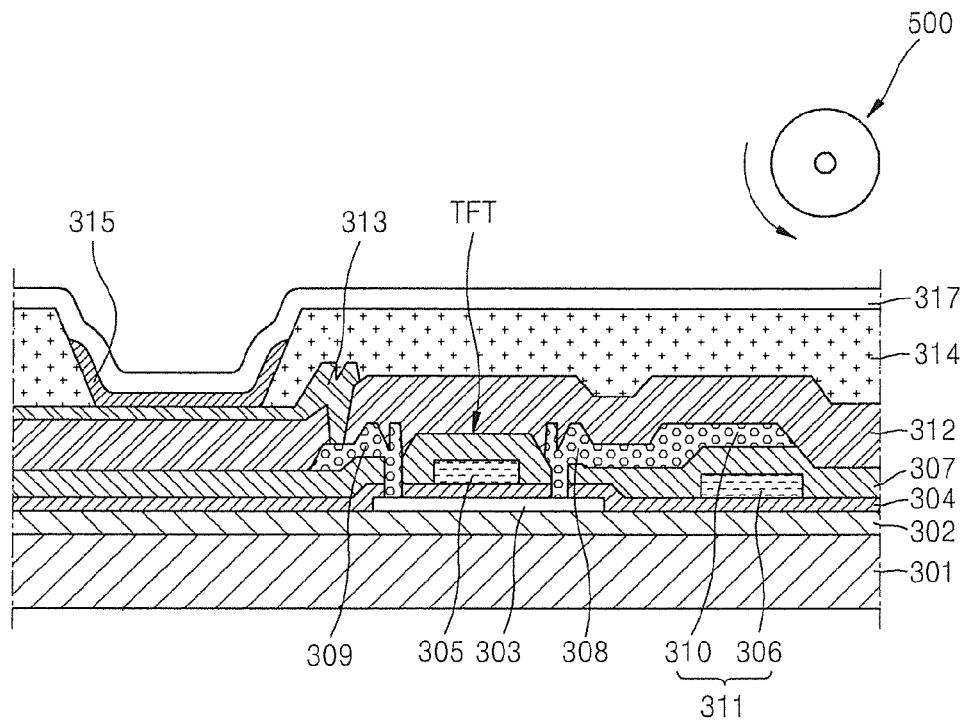
FIGS. 7A through 7C are cross-sectional views of a method of manufacturing an organic light-emitting display apparatus, according to another embodiment of the present invention.
Figure 7B:
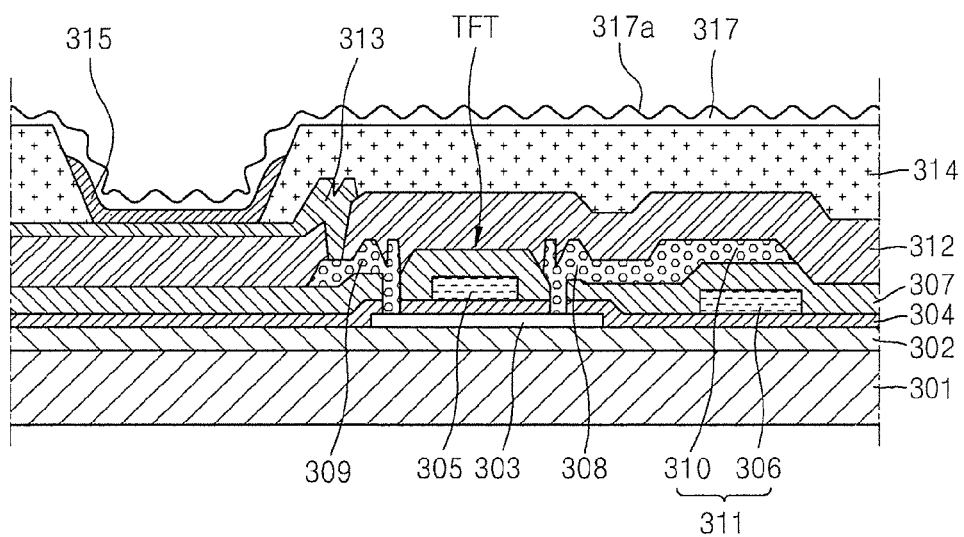
Figure 7C:
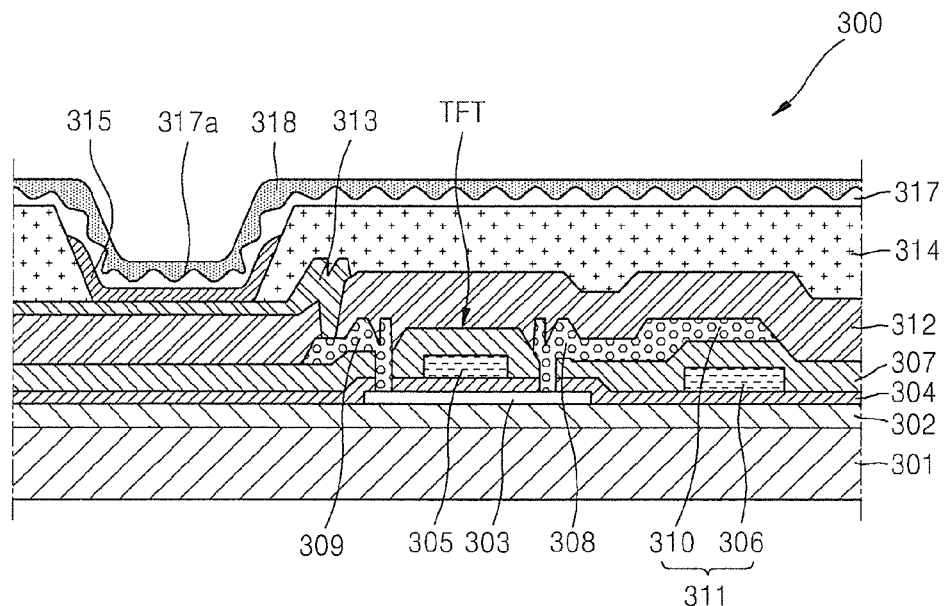

FIGS. 7A through 7C are cross-sectional views of a method of manufacturing an organic light-emitting display apparatus, according to another embodiment of the present invention.

Referring to FIG. 7A, a buffer layer 302 is formed on a substrate 301. A TFT is formed on the buffer layer 302. The TFT includes an active layer 303, a gate electrode 305, a source electrode 308, and a drain electrode 309. A gate insulating layer 304 insulates the active layer 303 and the gate electrode 305 from each other, and an interlayer insulating layer 307 insulates the gate electrode 305, the source electrode 308, and the drain electrode 309 from one another.

Also, one or more capacitors 311 may be formed on the substrate 301. A capacitor 311 includes a first capacitor electrode 306 and a second capacitor electrode 310. The first capacitor electrode 306 is formed on the gate insulating layer 304 and may be formed of the same material as a material used to form the gate electrode 305. The second capacitor electrode 310 is formed on the interlayer insulating layer 307 and may be formed of the same material as a material used to form the source electrode 308 or the drain electrode 309. Also, the second capacitor electrode 310 may be formed as one body with the source electrode 308.

A passivation layer 312 is formed on an upper surface of the TFT, and a first electrode 313 is connected to the drain electrode 309. A PDL 314 is formed on the first electrode 313 by using an insulating material. The PDL 314 is formed to expose a set or predetermined region of the first electrode 313, and an intermediate layer 315 contacts the exposed first electrode 313.

A second electrode 317 is formed on the intermediate layer 315.

Then, a rubbing process is performed on the surface of the second electrode 317 by using a rubbing member 500. An uneven face having a set or predetermined shape may be formed after the rubbing process is performed using the rubbing member 500 that includes a rubbing cloth.

Referring to FIG. 7B, a light-scattering face 317a is formed on the surface of the second electrode 317 by performing the rubbing process using the rubbing member 500. In more detail, the light-scattering face 317a is a face of the second electrode 317 opposite to a face of the second electrode facing the substrate 301. The light-scattering face 317a is formed as an uneven face and may be shaped as a stripe that extends in a set or predetermined direction.

Referring to FIG. 7C, a cover layer 318 is formed on the second electrode 317, thereby completing the manufacture of the organic light-emitting display apparatus 300. The cover layer 318 is formed on the second electrode 317 and protects the second electrode 317, in particular, the light-scattering face 317a of the second electrode 317. Also, the cover layer 318 may contain an external light-absorbing material so that external light anti-reflection characteristics of the organic light-emitting display apparatus 300 may be improved.

A sealing member may be disposed on the cover layer 318.

In the method of manufacturing the organic light-emitting display apparatus 300 according to the present embodiment, the light-scattering face 317a may be easily formed on the surface of the second electrode 317 by using the rubbing process. Also, since an uneven face is not formed on the intermediate layer 315 and the PDL 314, a change in the luminescence characteristics of visible light, generated by the organic emission layer of the intermediate layer 315 due to damage to the surface of the intermediate layer 315, is prevented or reduced, and thus, image quality characteristics of the organic light-emitting display apparatus 300 may be improved.

Also, the cover layer 318 is formed on an upper surface of the second electrode 317 and protects the light-scattering face 317a of the second electrode 317 efficiently, thereby improving the external light-scattering characteristics. Here, in one embodiment, the cover layer 318 contains an external light-absorbing material such that contrast characteristics and image quality characteristics of the organic light-emitting display apparatus 300 are further improved due to the improvement in the external light anti-reflection characteristics.

FIGS. 8A through 8D are cross-sectional views of a method of manufacturing an organic light-emitting display apparatus, according to another embodiment of the present invention.

Figure 8A:
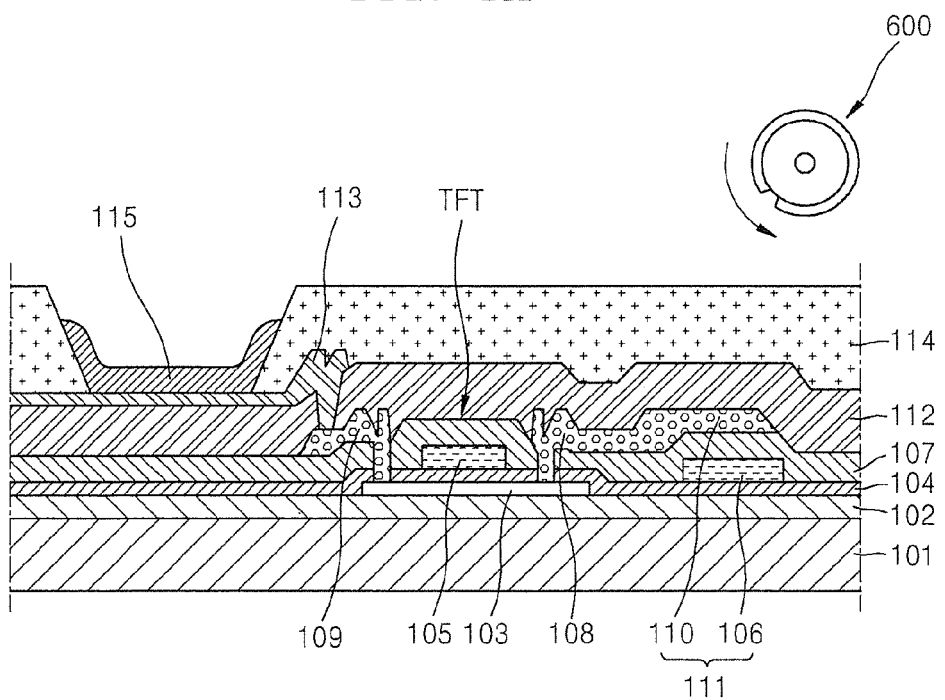
FIGS. 8A through 8D are cross-sectional views of a method of manufacturing an organic light-emitting display apparatus, according to another embodiment of the present invention.

Referring to FIG. 8A, a buffer layer 102 is formed on a substrate 101. A TFT is formed on the buffer layer 102. The TFT includes an active layer 103, a gate electrode 105, a source electrode 108, and a drain electrode 109. A gate insulating layer 104 insulates the active layer 103 and the gate electrode 105 from each other, and an interlayer insulating layer 107 insulates the gate electrode 105, the source electrode 108, and the drain electrode 109 from one another.

Also, one or more capacitors 111 may be formed on the substrate 101. A capacitor 111 includes a first capacitor electrode 106 and a second capacitor electrode 110. The first capacitor electrode 106 is formed on the gate insulating layer 104 and may be formed of the same material as a material used to form the gate electrode 105. The second capacitor electrode 110 is formed on the interlayer insulating layer 107 and may be formed of the same material as a material used to form the source electrode 108 or the drain electrode 109. Also, the second capacitor electrode 110 may be formed as one body with the source electrode 108.

The configuration of the capacitor 111 according to the present embodiment is a specific example, and the capacitor 111 may have various suitable shapes.

A passivation layer 112 is formed on an upper surface of the TFT, and a first electrode 113 is connected to the drain electrode 109. A PDL 114 is formed on the first electrode 113 by using an insulating material. The PDL 114 is formed to expose a set or predetermined region of the first electrode 113, and an intermediate layer 115 contacts the exposed first electrode 113.

The intermediate layer 115 includes an organic emission layer that produces visible light.

Then, the rubbing process is performed on the exposed surfaces of the intermediate layer 115 and the PDL 114 by using a rubbing member 600. An uneven face having a set or predetermined shape may be formed after the rubbing process is performed by using the rubbing member 600 that includes a rubbing cloth.

Figure 8B:
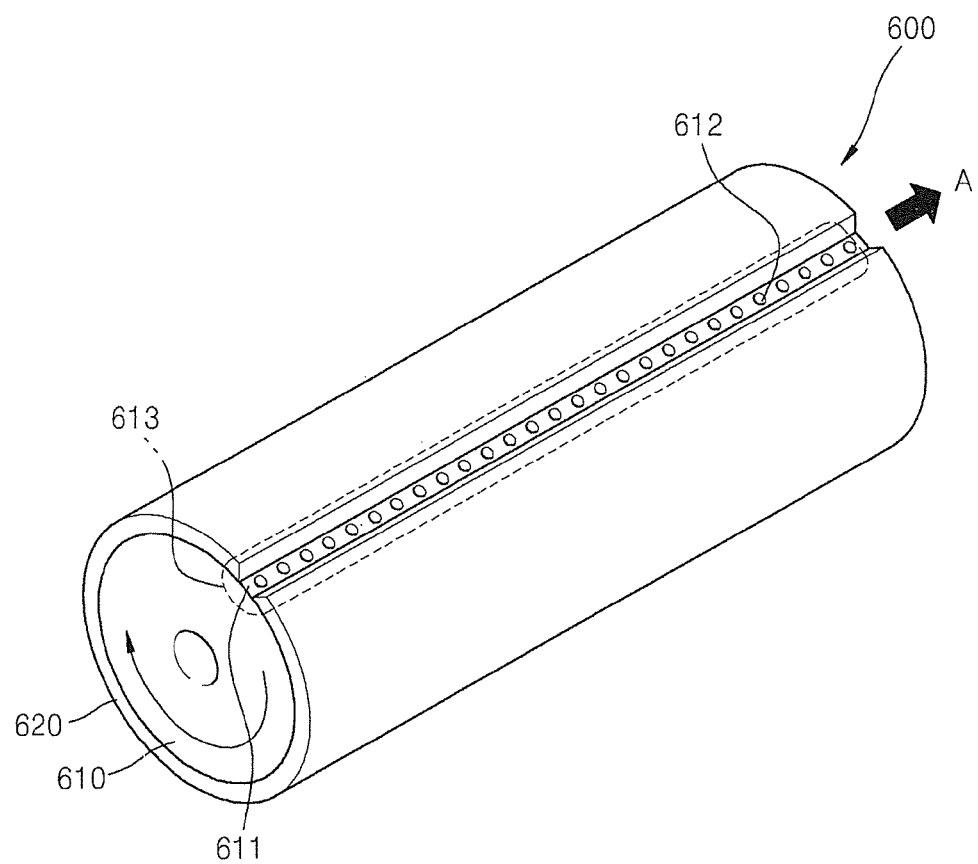

FIG. 8B is a perspective view of the rubbing member 600 of FIG. 8A, according to an embodiment of the present invention. Referring to FIG. 8B, the rubbing member 600 includes a main body portion 610 and a rubbing cloth 620. The main body portion 610 includes an exposed face 611 that is not covered by the rubbing cloth 620, and a plurality of adhesion holes 612 are formed in the exposed face 611. When the rubbing process is performed, residual products are formed. In more detail, when the rubbing process is performed on the surfaces of the intermediate layer 115 and the PDL 114 of FIG. 8A, the residual material remains in the surfaces of the intermediate layer 115 and the PDL 114. The residual material lowers the image quality characteristics of an organic light-emitting display apparatus to be manufactured in a subsequent process. In the present embodiment, the residual material that remains after the rubbing process is performed is removed through the adhesion holes 612. In other words, the residual material adheres to the adhesion holes 612 so that the surfaces of the intermediate layer 115 and the PDL 114 may not be contaminated by the residual material. The residual material is moved to a predetermined space 613 in the main body portion 610 through the adhesion holes 612. The residual material may be removed in an arrow direction (A-direction) of FIG. 8B. In more detail, the residual material may be removed by hand or by connecting to the rubbing member 600 a pump for removing (or adhering or exhausting) the residual material in the A-direction.

Figure 8C:
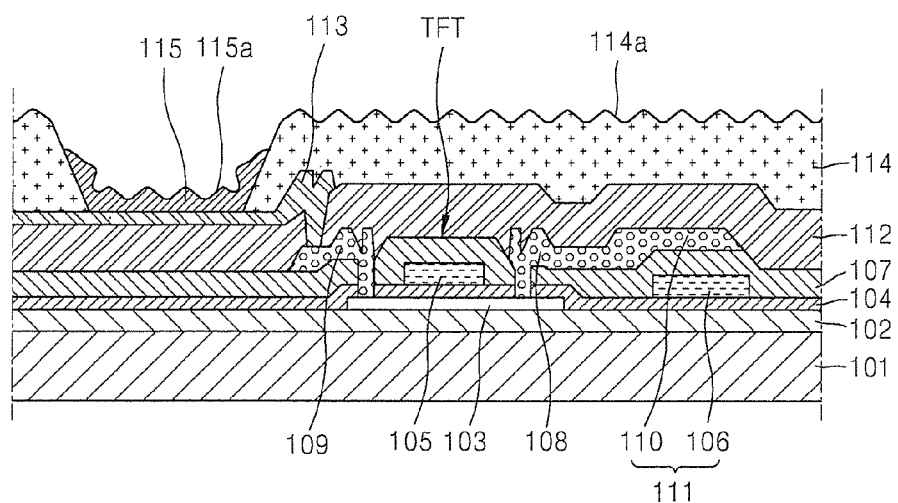

Referring to FIG. 8C, by performing the rubbing process using the rubbing member 600, an uneven face 115a is formed on the surface of the intermediate layer 115, and an uneven face 114a is formed on the surface of the PDL 114.

The uneven shapes of the uneven face 115a of the intermediate layer 115 and the uneven face 114a of the PDL 114 may be formed as stripes that extend in a set or predetermined direction. In other words, the uneven faces 114a and 115a may be shaped as stripes that extend in a set or predetermined direction, by performing the rubbing process by moving the rubbing member 600 in a set or predetermined direction.

However, the present invention is not limited thereto, and the uneven faces 114a and 115a may be shaped as stripes that extend in a plurality of directions. In other words, when the rubbing process is performed, the uneven faces 114a and 115a may be shaped as stripes that proceed in a plurality of directions and are formed in various suitable directions.

Figure 8D:
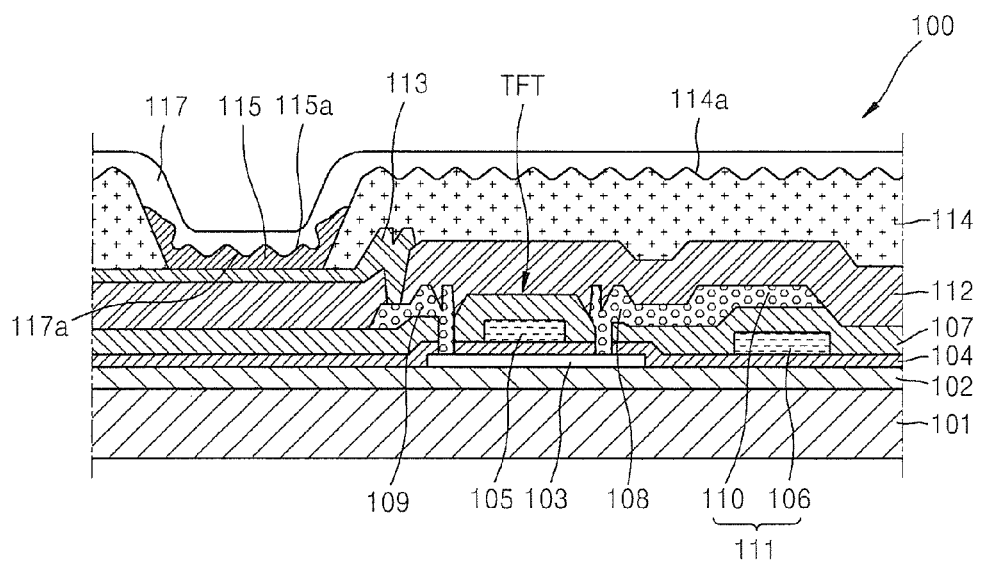

Referring to FIG. 8D, the organic light-emitting display apparatus 100 is completely manufactured by forming a second electrode 117. The second electrode 117 includes a light-scattering face 117a. In more detail, the light-scattering face 117a is a face of the second electrode 117 (facing) in a direction toward the substrate 101. The light-scattering face 117a contacts the uneven face 115a of the intermediate layer 115 and the uneven face 114a of the PDL 114. The light-scattering face 117a is formed as an uneven face having an uneven shape corresponding to the uneven shapes of the uneven faces 114a and 115a.

A sealing member may be disposed on the second electrode 117. The sealing member protects the intermediate layer 115 and the other layers from external moisture, oxygen, or the like. The sealing member is formed of a transparent material. To this end, the sealing member may be formed of glass, plastic, or a combination of an organic material and an inorganic material.

In the present embodiment, the organic light-emitting display apparatus 100 is manufactured by using the rubbing member 600. However, the organic light-emitting display apparatuses 200 and 300 of FIGS. 3 and 4 may be manufactured using the rubbing member 600.

In the method of manufacturing the organic light-emitting display apparatus 100 according to the present embodiment, the uneven faces 114a and 115a of the PDL 114 and the intermediate layer 115 are formed using the rubbing process, and the second electrode 117 contacts the uneven faces 114a and 115a so that the light-scattering face 117a may be easily formed.

In addition, the rubbing process is performed using the rubbing member 600, including the adhesion holes 612, so that the surfaces of the intermediate layer 115 and the PDL 114 may be easily prevented or protected from being contaminated by the residual material formed after the rubbing process is performed.

As described above, in an organic light-emitting display apparatus and a method of manufacturing the same according to embodiments of the present invention, image quality characteristics of the organic light-emitting display apparatus may be easily improved.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An organic light-emitting display apparatus comprising:
a substrate;
a first electrode on the substrate;
a pixel-defining layer (PDL) on the first electrode to expose a region of the first electrode;
an intermediate layer in the exposed region of the first electrode and comprising an organic emission layer; and
a second electrode having a light-scattering face facing the substrate or facing oppositely away from the substrate, the second electrode being on the intermediate layer,
wherein a surface of the intermediate layer facing the first electrode is smooth.

2. The organic light-emitting display apparatus of claim 1, wherein the light-scattering face is an uneven face.

3. The organic light-emitting display apparatus of claim 1, wherein the light-scattering face is formed using a rubbing process.

4. The organic light-emitting display apparatus of claim 1, wherein the light-scattering face is formed in a region corresponding to the intermediate layer and the PDL.

5. The organic light-emitting display apparatus of claim 1, wherein the intermediate layer and the PDL each has an uneven face, and the light-scattering face contacts the uneven faces of the intermediate layer and the PDL.

6. The organic light-emitting display apparatus of claim 5, wherein the light-scattering face has an uneven face corresponding to uneven shapes of the uneven faces of the intermediate layer and the PDL.

7. The organic light-emitting display apparatus of claim 1, further comprising a cover layer on the second electrode, wherein the light-scattering face is a face of the second electrode opposite to the face of the second electrode facing the substrate.

8. The organic light-emitting display apparatus of claim 7, wherein the cover layer comprises an external light-absorbing material.

9. The organic light-emitting display apparatus of claim 1, further comprising a thin-film transistor (TFT) between the substrate and the first electrode, the TFT comprising an active layer, a gate electrode, a source electrode, and a drain electrode, and being electrically connected to the first electrode.

10. An organic light-emitting display apparatus comprising:
a substrate;
a first electrode on the substrate;
a pixel-defining layer (PDL) on the first electrode to expose a region of the first electrode;
an intermediate layer in the exposed region of the first electrode and comprising an organic emission layer;
a second electrode having a light-scattering face facing the substrate or facing oppositely away from the substrate, the second electrode being on the intermediate layer; and
an insertion layer on the intermediate layer and the PDL, wherein:
the second electrode is on an upper surface of the insertion layer, the insertion layer comprises an uneven face, and
the light-scattering face contacts the uneven face of the insertion layer.

11. The organic light-emitting display apparatus of claim 10, wherein the light-scattering face has an uneven face corresponding to an uneven shape of the uneven face of the insertion layer.

12. The organic light-emitting display apparatus of claim 10, wherein the insertion layer has a plurality of trenches, and the second electrode contacts the intermediate layer through the plurality of trenches.

13. The organic light-emitting display apparatus of claim 10, wherein the insertion layer comprises a polymer material.

14. The organic light-emitting display apparatus of claim 10, wherein the insertion layer comprises a black matrix material.

15. The organic light-emitting display apparatus of claim 10, wherein the insertion layer comprises a color filter material.

16. A method of manufacturing an organic light-emitting display apparatus, the method comprising:
forming a first electrode on a substrate;
forming a pixel-defining layer (PDL) on the first electrode to expose a region of the first electrode;
forming an intermediate layer on the exposed region of the first electrode, the intermediate layer comprising an organic emission layer; and
forming a second electrode, the second electrode having a light-scattering face facing the substrate or facing oppositely away from the substrate,
wherein a surface of the intermediate layer facing the first electrode is smooth.

17. The method of claim 16, wherein the light-scattering face is formed by using a rubbing process.

18. The method of claim 17, wherein the rubbing process is performed by a rubbing member, and the rubbing member has a plurality of adhesion holes, and a residual material formed during the rubbing process is exhausted through the plurality of adhesion holes.

19. The method of claim 18, wherein the rubbing member comprises a main body portion and a rubbing cloth disposed on an outer circumferential surface of the main body portion, and the main body portion has an exposed face that is not covered by the rubbing cloth, and the adhesion holes are formed in the exposed face.

20. The method of claim 16, wherein a rubbing process is performed on surfaces of the intermediate layer and the PDL so that the intermediate layer and the PDL have uneven faces facing toward the second electrode, and the light-scattering face of the second electrode contacts the uneven faces of the organic emission layer and the PDL.

21. The method of claim 16, further comprising forming an insertion layer between the intermediate layer and the PDL and the second electrode, wherein the insertion layer has an uneven face formed by performing a rubbing process, and the light-scattering face contacts the uneven face of the insertion layer.

22. The method of claim 21, wherein, when the rubbing process is performed, the insertion layer has a plurality of trenches and the intermediate layer exposed through the plurality of trenches is configured to contact the second electrode through the plurality of trenches.

23. The method of claim 16, further comprising forming a cover layer on an upper surface of the second electrode, wherein the light-scattering face of the second electrode is formed by performing a rubbing process on a face of the second electrode opposite to a face of the second electrode facing the substrate, and the light-scattering face contacts the cover layer.

* * * * *